(12) United States Patent
Su et al.

(10) Patent No.: US 9,560,771 B2
(45) Date of Patent: Jan. 31, 2017

(54) BALL GRID ARRAY AND LAND GRID ARRAY HAVING MODIFIED FOOTPRINT

(71) Applicant: OMNIVISION TECHNOLOGIES, INC., Santa Clara, CA (US)

(72) Inventors: Ying-Tang Su, Longtan Township (TW); Wei-Feng Lin, Hsinchu (TW); Kah-Ong Tan, Shanghai (CN)

(73) Assignee: OmniVision Technologies, Inc., Santa Clara, CA (US)

( * ) Notice: Subject to any disclaimer, the term of this patent is extended or adjusted under 35 U.S.C. 154(b) by 96 days.

(21) Appl. No.: 13/686,552

(22) Filed: Nov. 27, 2012

(65) Prior Publication Data

US 2014/0146505 A1 May 29, 2014

(51) Int. Cl.
| | |
|---|---|
| *H05K 1/11* | (2006.01) |
| *H05K 1/18* | (2006.01) |
| *H05K 13/04* | (2006.01) |
| *H05K 3/34* | (2006.01) |
| *H04N 5/225* | (2006.01) |
| *H01L 27/146* | (2006.01) |
| *H01L 23/498* | (2006.01) |

(52) U.S. Cl.
CPC ....... *H05K 3/3436* (2013.01); *H01L 23/49838* (2013.01); *H01L 27/14618* (2013.01); *H04N 5/2257* (2013.01); *H01L 23/49816* (2013.01); *H01L 2224/16225* (2013.01); *H01L 2924/0002* (2013.01); *H05K 1/111* (2013.01); *H05K 2201/094* (2013.01); *H05K 2201/10121* (2013.01); *H05K 2201/10734* (2013.01); *Y02P 70/613* (2015.11); *Y10T 29/49144* (2015.01)

(58) Field of Classification Search
CPC ...... H05K 1/111; H05K 1/181; H05K 3/3436; H01L 27/14601

USPC .................................. 361/773; 257/779–780
See application file for complete search history.

(56) References Cited

U.S. PATENT DOCUMENTS

| | | | | |
|---|---|---|---|---|
| 6,137,062 A | * | 10/2000 | Zimmerman | ..... H01L 23/49816 174/260 |
| 6,268,568 B1 | * | 7/2001 | Kim | ............................... 174/250 |
| 7,368,821 B2 | | 5/2008 | Kim et al. | |

(Continued)

FOREIGN PATENT DOCUMENTS

| | | |
|---|---|---|
| CN | 1299518 A | 6/2001 |
| CN | 101887878 A | 11/2010 |

(Continued)

OTHER PUBLICATIONS

TW 102129337—First Office Action with English Translation, issued Mar. 10, 2015, 14 pages.

(Continued)

*Primary Examiner* — Timothy Thompson
*Assistant Examiner* — Michael E Moats, Jr.
(74) *Attorney, Agent, or Firm* — Blakely Sokoloff Taylor & Zafman LLP

(57) ABSTRACT

An apparatus includes a substrate having a surface and a plurality of solder balls arranged on the surface to form a ball grid array. A portion of the plurality of solder balls is arranged to have a pitch between adjacent solder balls. The adjacent solder balls having the pitch have a shape of a truncated sphere. At least one solder ball of the plurality of solder balls is included in a solder island on the surface having a shape that is different than the shape of the truncated sphere.

19 Claims, 9 Drawing Sheets

(56) References Cited

U.S. PATENT DOCUMENTS

| | | | |
|---|---|---|---|
| 7,911,019 B2 | 3/2011 | Hiltunen et al. | |
| 2005/0140025 A1 | 6/2005 | Murtuza | |
| 2009/0045508 A1* | 2/2009 | Romero | H05K 1/111 |
| | | | 257/737 |
| 2010/0289104 A1 | 11/2010 | Ra et al. | |
| 2011/0317065 A1 | 12/2011 | Lin et al. | |
| 2013/0175649 A1* | 7/2013 | Eromaki et al. | 257/432 |

FOREIGN PATENT DOCUMENTS

| | | |
|---|---|---|
| JP | 2006-294656 A | 10/2006 |
| WO | WO 0019514 A1 | 6/2000 |
| WO | WO 2011/158069 A1 | 12/2011 |

OTHER PUBLICATIONS

CN 201310409760.3—First Office Action with English Translation, issued Mar. 8, 2016, 17 pages.

ROC (Taiwan) Patent Application No. 102129337—Second Office Action and Search Report with English Translation, issued Nov. 18, 2015, (16 pages).

\* cited by examiner

BALL GRID ARRAY AND LAND GRID ARRAY HAVING MODIFIED FOOTPRINT

BACKGROUND INFORMATION

Field of the Disclosure

The present invention relates generally to a package including a ball grid array (BGA) or a land grid array (LGA), more specifically to a package including BGA or LGA having a modified footprint.

Background

Semiconductor chips are found in virtually every electrical product manufactured today. Chips are used not only in very sophisticated industrial and commercial electronic equipment, but also in many household and consumer items. Chips are packaged in packages, and packages are mounted on printed circuit boards (PCB) in devices such as a mobile phone or other electronic devices.

For example, an image sensor chip may be packaged in a suitable package. The package is then mounted on a PCB in a device. The device may be a mobile phone or other electronic device. The package may be mounted on the PCB by reflowing the ball grid array (BGA) at the bottom of the package on the PCB. The BGA is an array of solder balls formed at the bottom of the package. In the reflowing process, the solder balls are heated and melted, permanently forming solder joints between the package and the PCB. The reflowed BGA including the formed solder joints not only provides electrical connection between the package and the PCB, it also provides the mechanical support for holding the package to the PCB. In some occasions, an increased mechanical strength for holding the package to the PCB is desired.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
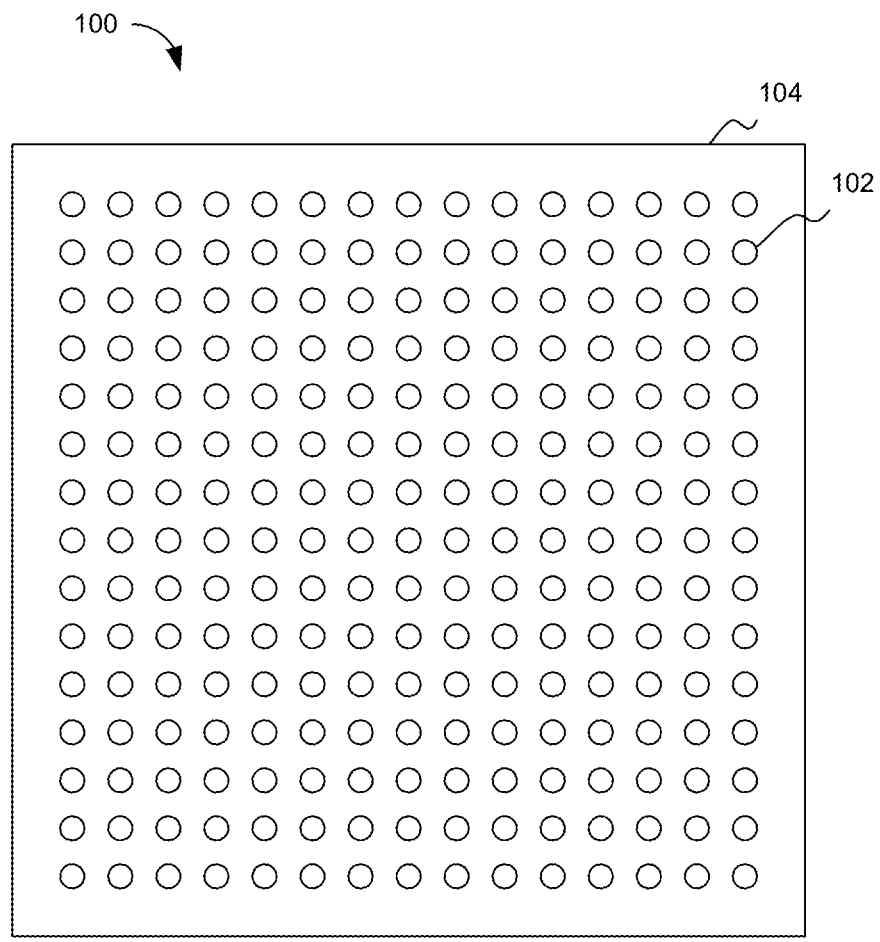
FIG. 1A is a schematic diagram of a footprint of a filled BGA.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As will be shown, methods and apparatuses that provide examples of strengthened mechanical support for holding a package to a PCB in a device are disclosed. As will be appreciated, a plurality of solder balls of a BGA may be combined and modified into a larger solder island that after reflowing, the formed solder joint will provide stronger mechanical support as compared with that provided by the solder joints formed solely by the reflowed solder balls.

It is noted that a package including a BGA in accordance with the teachings of the present invention is described herein for explanation purposes. It is appreciated that the teachings of the present invention are applicable to all types of packages that include a BGA, including a chip scale package (CSP) BGA, a ceramic BGA (CBGA), and the like. For instance, the teachings of the present invention may also be extended to a land grid array (LGA) package. A LGA package is a standard BGA package having no sphere shaped solder balls. Instead the LGA solder interconnect is formed solely by solder paste applied at the substrate of the package forming solder lands instead of solder balls.

Figure 1B:
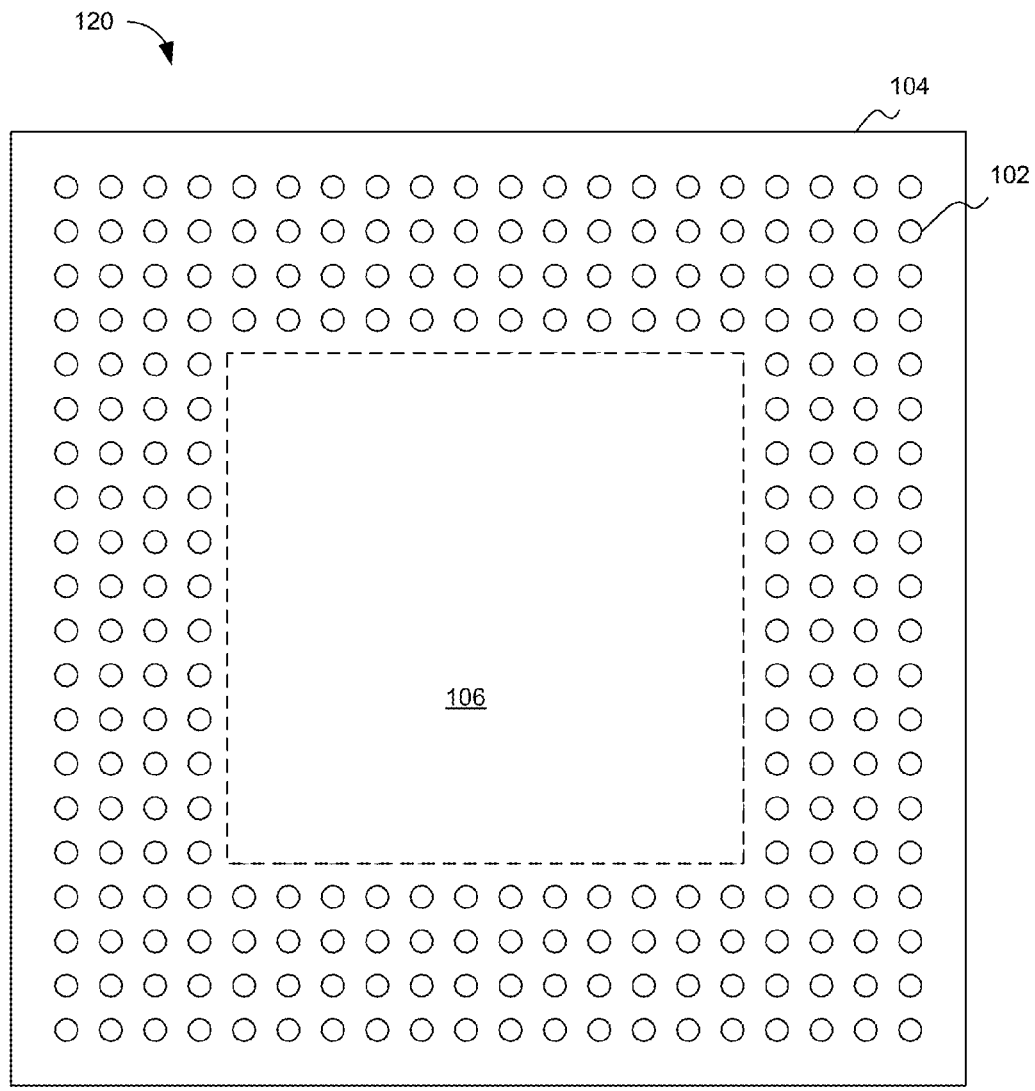
FIG. 1B is a schematic diagram of a footprint of a partially-filled BGA.

To illustrate, FIG. 1A is a schematic diagram of a footprint 100 of a filled BGA. Surface mount solder balls 102 are mounted on a surface 104 of a substrate (not shown) of a package (not shown). In one example, there are 225 solder balls 102 at all grid points on surface 104. Accordingly, it is called a filled BGA. FIG. 1B is a schematic diagram of a footprint 120 of a partially filled BGA. Accordingly, not every grid point has a solder ball. Surface mount solder balls 102 are mounted on a surface 104. In one example, there are 256 solder balls 102 mounted on surface 104. As shown in the depicted example, there are no solder balls in a center area 106.

Figure 2A:
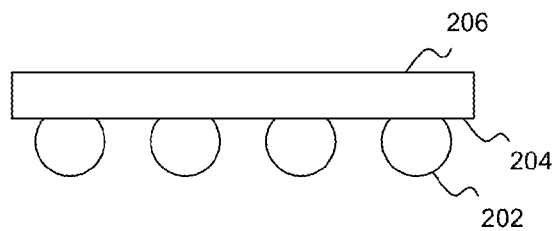
FIG. 2A illustrates a vertical cross-section of solder balls mounted on a surface of a substrate.
Figure 2B:
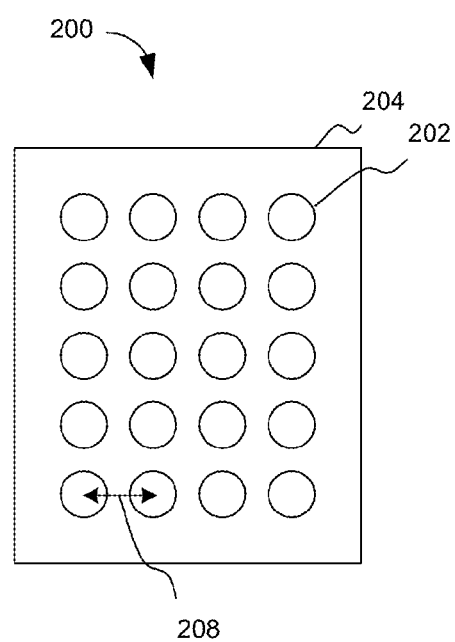
FIG. 2B illustrates a horizontal cross-section of solder balls mounted on a surface of a substrate.

Although a footprint of a partially-filled BGA may have varying distribution patterns of solder balls, the shape of a solder ball is determined as a truncated sphere as shown in FIG. 2A. FIG. 2A illustrates a vertical cross-section of solder balls 202 mounted on a surface 204 of a substrate 206 of a package (not shown). FIG. 2B illustrates a horizontal cross-section of the same solder balls 202 mounted on surface 204 in a BGA 200. Furthermore, a pitch 208 between adjacent solder balls of BGA 200, as shown in FIG. 2B, may also be determined. For example, as registered with the Joint Electron Device Engineering Council (JEDEC) committee, pitch 208 should be 1.5 mm (59 mil), 1.27 mm (50 mil), or 1.0 mm (39 mil).

A problem may occur with the currently available BGAs or LGAs when the package receives a shock that produces a shear strain. The shear strain may be too large for the reflowed BGA or LGA to withstand, and thus the package may be knocked off from the mounting PCB. Thus the board level reliability is reduced when a currently available BGA or LGA is applied. The following description also applies to a LGA, although only a BGA is discussed herewith for explanation purposes.

Taking advantage that not all solder balls are electrically connected, i.e., not connected (NC) pins, and some solder balls share the same function, a plurality of solder balls can be combined to form a larger solder island in accordance with the teachings of the present invention. A solder island may not have a truncated sphere shape as a solder ball. Since the solder island has more mass and larger size than a solder ball, the mechanical strength between a package and a PCB provided by the reflowed solder island is increased as compared with that of a solder ball or even that of the sum of individual solder balls combined.

In one example, at least one solder ball is modified to form at least one solder island having a shape different from truncated sphere. In another example, at least two solder balls are combined and modified to form at least one solder island having a shape different from a truncated sphere. The height of the solder island is the same as the height of the solder balls, and therefore the coplanarity between the package and the PCB is maintained.

Figure 3A:
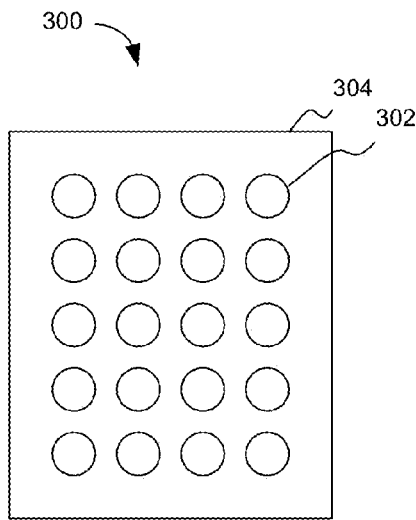
FIG. 3A illustrates a footprint of a BGA having solder balls mounted on a surface.
Figure 3B:
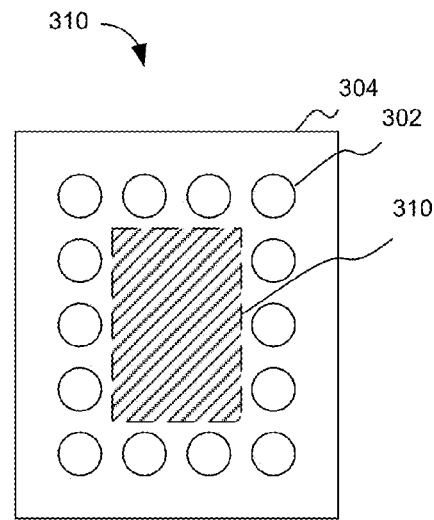
FIG. 3B illustrates a modified footprint of a BGA having solder balls mounted on a surface in accordance with the teachings of the present invention.
Figure 3C:
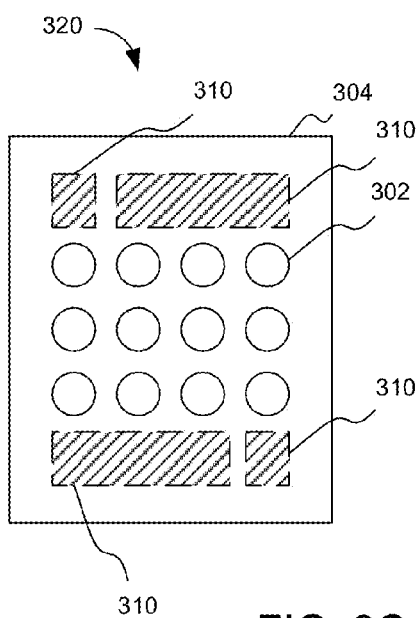
FIG. 3C illustrates a modified footprint of a BGA having solder balls mounted on a surface in accordance with the teachings of the present invention.
Figure 3D:
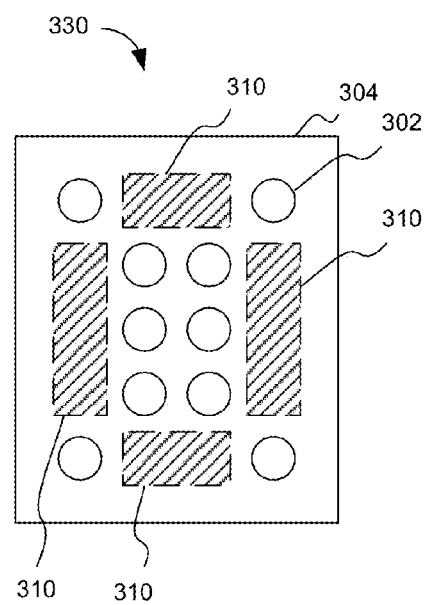
FIG. 3D illustrates a modified footprint of a BGA having solder balls mounted on a surface in accordance with the teachings of the present invention.

FIG. 3A illustrates a footprint 300 of a BGA having solder balls 302 arranged on a surface 304. FIGS. 3B-3D illustrate additional examples of footprints 310, 320, and 330 of a BGA having solder balls 302 arranged on a surface 304, respectively, in accordance with the teachings of the present invention. For example, shaded areas 310 illustrate solder islands that combine a plurality of solder balls. It is appreciated that the shape of a solder island is not limited to a circle or an ellipse. The shape of the solder island may be any shape, including for example, a square or a rectangle as shown in FIGS. 3B-3D. After reflowing, the solder islands form solder joints between the package and the PCB. The reflowed BGA including solder joints formed by the solder islands between the package and the PCB provides increased mechanical strength for holding the package to the PCB.

Figures 4A, 4B:
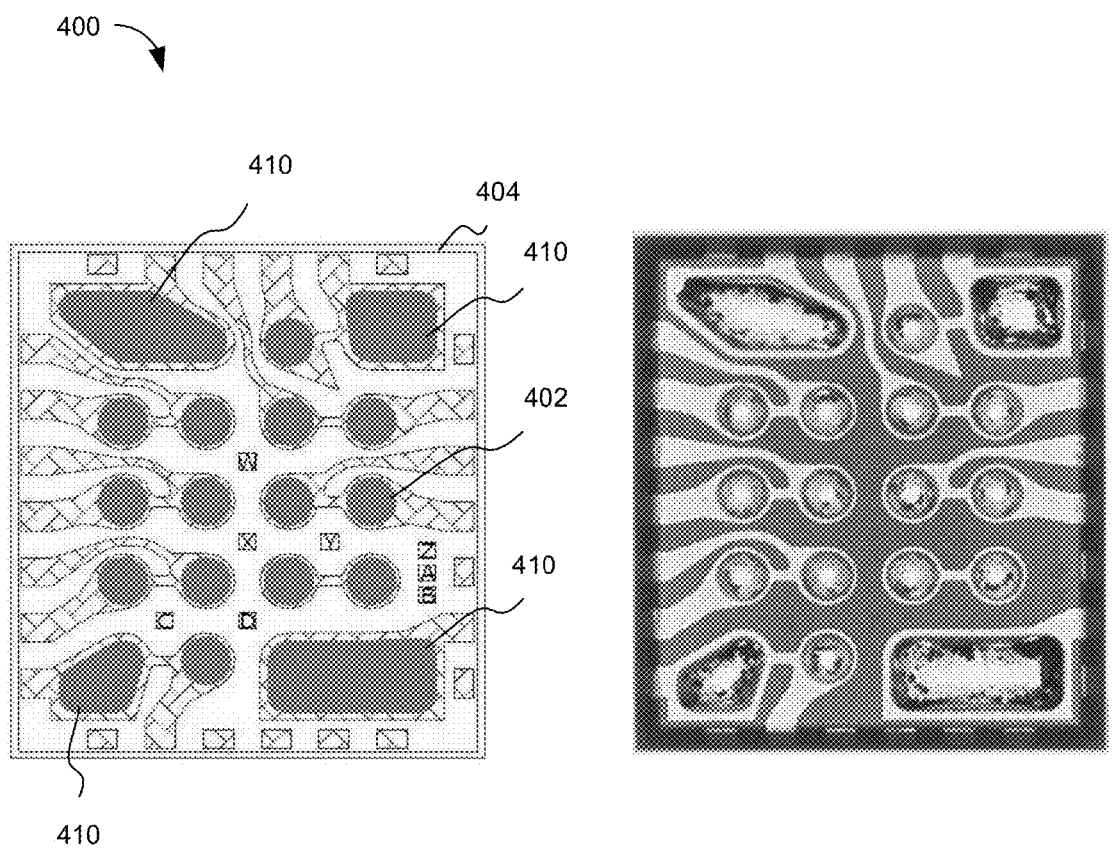
FIG. 4A illustrates a modified footprint of a BGA having solder balls mounted on a surface in accordance with the teachings of the present invention.
FIG. 4B shows a photograph of a BGA having modified footprint of FIG. 4A.

FIG. 4A illustrates another example modified footprint 400 of a BGA having solder balls 402 and solder islands 410 arranged on a surface 404, in accordance with the teachings of the present invention. In the illustrated example, the circular dark areas are solder balls 402. FIG. 4B shows a photograph of a BGA having modified footprint 400 of FIG. 4A. As shown in FIGS. 4A and 4B, solder islands 410 can be any shape, including irregular shapes. In one example, although the shapes of solder islands 410 are different than truncated spheres, the height of solder islands 410 is the same as the height of solder balls 402.

Figure 5A:
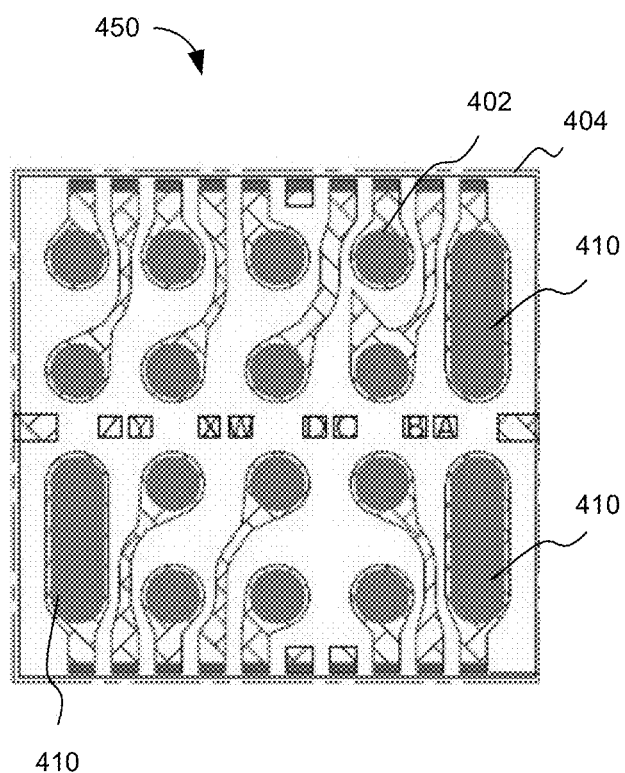
FIG. 5A illustrates a modified footprint of a BGA having solder balls mounted on a surface in accordance with the teachings of the present invention.
Figure 5B:
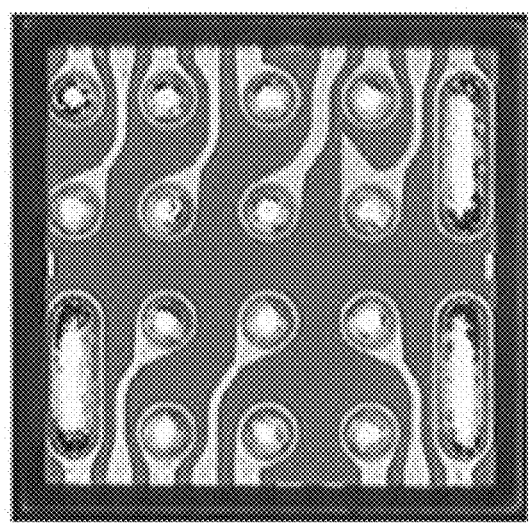
FIG. 5B shows a photograph of a BGA having modified footprint of FIG. 5A.

FIG. 5A illustrates another example modified footprint 450 of BGA having solder balls 402 and solder islands 410 arranged on a surface 404, in accordance with the teachings of the present invention. In the depicted example, the circular dark areas are solder balls 402. FIG. 5B shows a photograph of a BGA having modified footprint 450 of FIG. 5A. After reflowing, the solder islands form solder joints between the package and the PCB. The reflowed BGA including solder joints formed by the solder islands between the package and the PCB provide increased mechanical strength for holding the package to the PCB in accordance with the teachings of the present invention.

Figure 6A:
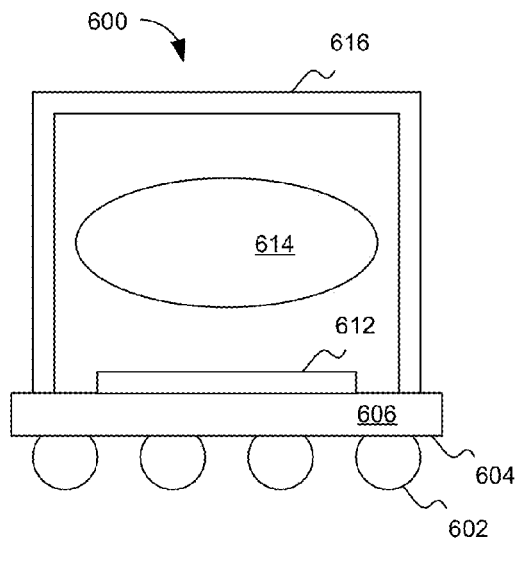
FIG. 6A shows a schematic diagram of a camera module in accordance with the teachings of the present invention.
Figure 8A:
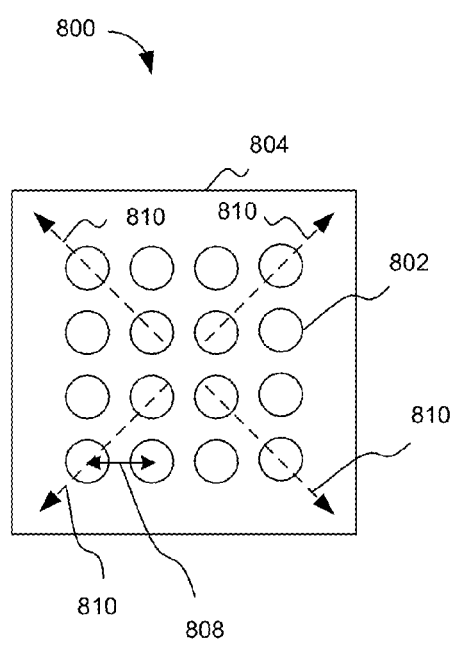
FIG. 8A illustrates a footprint of a BGA or LGA having uniform pitch between adjacent circular marks.
Figure 8B:
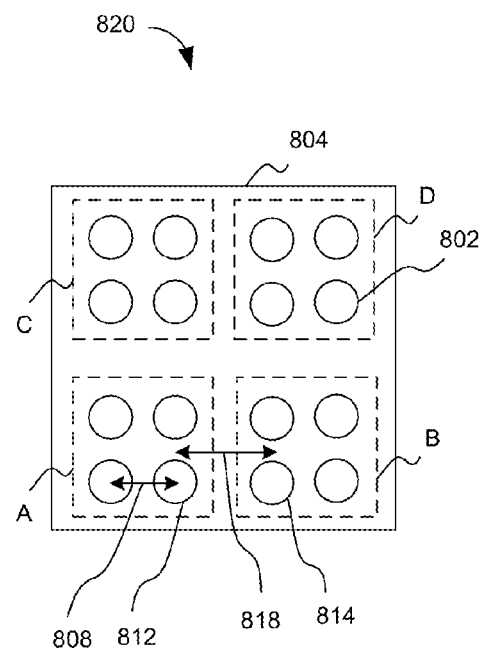
FIG. 8B illustrates a modified footprint of a BGA or a LGA having a plurality of groups of circular marks in accordance with the teachings of the present invention.

FIG. 6A illustrates an example camera module 600 mounted on a BGA, in accordance with the teachings of the present invention. In the depicted example, camera module 600 includes a housing 616, a lens 614, an image sensor 612, a substrate 606, and a BGA including solder balls 602 arranged on a surface 604 of substrate 606. The BGA is attached to the bottom of the camera module. In one example, the BGA is arranged on the surface of a substrate included in a PCB (not shown). To increase the mechanical strength between camera module 600 and a PCB after reflowing, the footprint of the BGA including solder balls 602 may be modified as shown in FIGS. 3B-3D, FIGS. 4A and 4B, FIGS. 5A and 5B, and FIGS. 8A and 8B. FIGS. 8A and 8B, as will be described in further detail below.

Figure 6B:
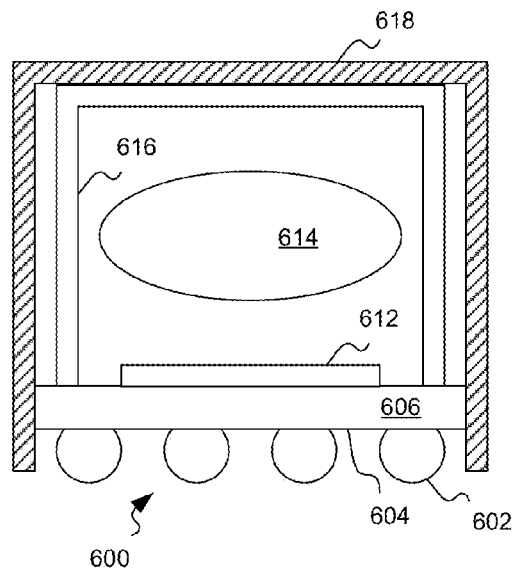
FIG. 6B shows a schematic diagram of a reinforcement structure disposed over a camera module in accordance with the teachings of the present invention.
Figure 7A:
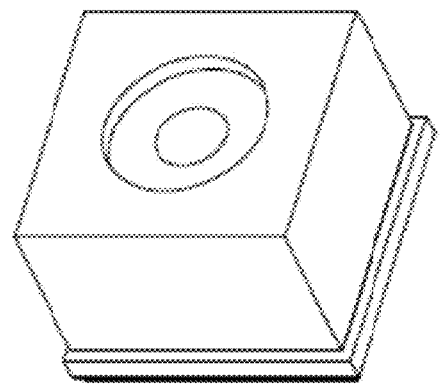
FIG. 7A shows a perspective view of a camera module in accordance with the teachings of the present invention.
Figure 7B:
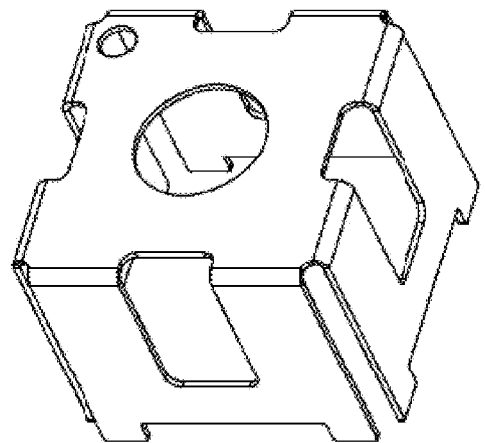
FIG. 7B shows a perspective view of a reinforcement structure in accordance with the teachings of the present invention.
Figure 7C:
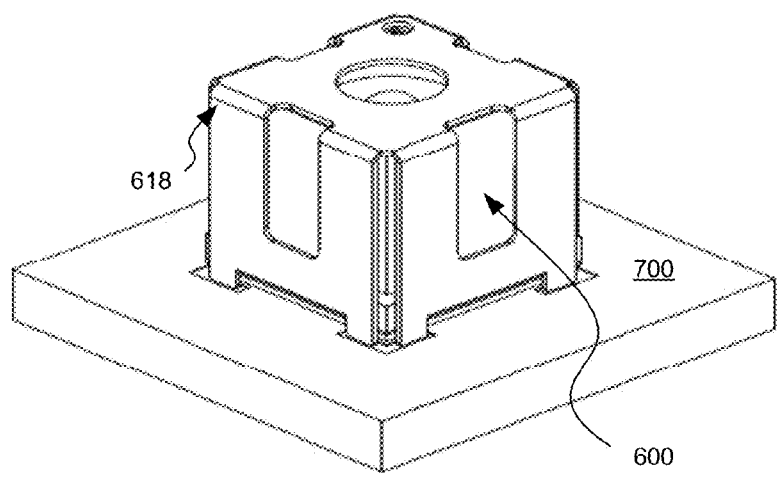
FIG. 7C shows a perspective view of a reinforcement structure disposed over a camera module on a PCB in accordance with the teachings of the present invention.

FIG. 6B illustrates an example reinforcement structure 618 disposed over an example camera module 600, in accordance with the teachings of the present invention. Perspective views of camera module 600 and reinforcement structure 618 are illustrated in below in FIGS. 7A and 7B, respectively, in accordance with the teachings of the present invention. FIG. 7C illustrates a perspective view of reinforcement structure 618 disposed over an example camera module 600 on a PCB 700. Although the solder balls are not visible in the perspective views in FIGS. 7A-7C, after reflowing, the solder islands form solder joints (not shown) between the PCB and the camera module having the BGA at its bottom including the solder islands. The reflowed BGA including solder joints formed by the solder islands (not shown) between the camera module and the PCB provide increased mechanical strength for holding the camera module to the PCB in accordance with the teachings of the present invention.

Figure 6C:
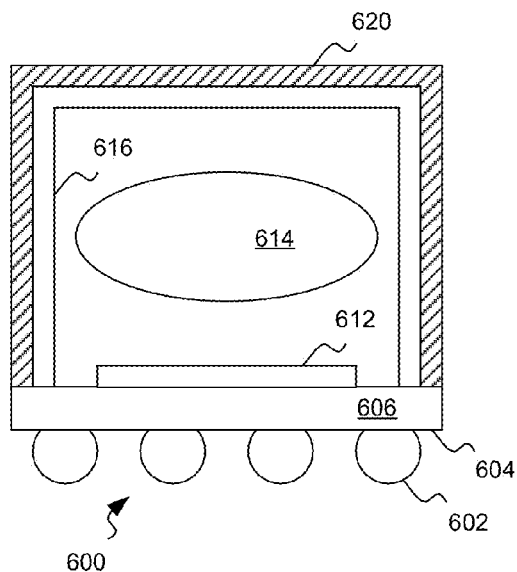
FIG. 6C shows a schematic diagram of a reinforcement structure disposed over a camera module in accordance with the teachings of the present invention.

Referring now to the example of FIG. 6C, a reinforcement structure 620 disposed over a camera module 600, in accordance with the teachings of the present invention. A difference between the examples shown in FIGS. 6B and 6C is that reinforcement structure 618 of FIG. 6B may be attached to PCB 700, as shown in FIG. 7C, for example by glue or another technique. Reinforcement structure 620 of FIG. 6C may be disposed on substrate 606 and not attached to the PCB. It is appreciated that FIGS. 6B and 6C are provided as examples, and that other arrangements of reinforcement structures are also possible in accordance with the teachings of the present invention.

To reflow a BGA having an example modified footprint as shown in FIGS. 3B-3D, FIGS. 4A and 4B, FIGS. 5A and 5B, and FIGS. 8A and 8B on a PCB, the pattern of solder pads on the PCB is modified accordingly to match the modified footprint of the BGA including solder islands. In one example, the solder pads on the PCB are modified to match the pattern of the solder balls and solder island of the BGA. The BGA having the modified footprint is then reflowed on the PCB having a modified pattern of solder pads that matches the modified footprint of the BGA. In the reflowing process, the solder balls and solder islands are heated and melted, permanently forming solder joints between the package having the BGA and the PCB. The reflowed BGA including the solder joints formed from the solder islands provide an increased mechanical strength between the package having the BGA and the PCB in accordance with the teachings of the present invention. In one example, the package may be a camera module or a reinforcement structure disposed on a camera module as shown in FIGS. 6A-6C and 7A-7C.

As mentioned previously, a land grid array (LGA) is similar to a BGA, except that the LGA includes solder lands instead of solder balls. The thickness of solder paste in a solder lands is less than the thickness of a solder ball. Thus, FIGS. 1A and 1B and FIG. 2B represent the LGA as well as the BGA. Solder balls are replaced by circular lands of solder paste. The modified footprint patterns as shown in FIGS. 3B-3D, FIG. 4A, and FIG. 5A may also apply to LGA. Several circular solder lands are combined and modified to form a solder island, which has shape different from the circular solder land. In one example, a solder land is modified to form a larger solder island.

A footprint of a BGA or a LGA may be represented by an example footprint 800 as illustrated in FIG. 8A. In the example, a solder ball or a solder land is represented by a circular mark 802. In one example, circular mark 802 represents a cross-section of a solder ball and a surface 804. The solder ball is mounted on surface 804. In one example, circular mark 802 represents a cross-section of a solder land and a surface 804. The solder land is mounted on surface 804. In the illustrated example, all circular marks in footprint 800 are distributed with a uniform pitch 808 between adjacent marks. In one example, pitch 808 between adjacent marks may be 1.5 mm (59 mil), 1.27 mm (50 mil), or 1.0 mm (39 mil).

In one example, footprint 800 may be modified to a footprint 820 as shown in FIG. 8B in accordance with the teachings of the present invention. In one example, footprint 820 includes a plurality of groups of circular marks, such as for example, groups A, B, C, and D. A group of circular marks includes a plurality of circular marks having uniform pitch 808 between adjacent marks. A distance 818 between adjacent marks from different groups, for example, between a circular mark 812 from group A and a circular mark 814 from group B, is different from pitch 808 between adjacent marks of a group of circular marks. FIG. 8A illustrates that groups A, B, C, and D may be formed by moving circular marks as shown by arrows 810 to the corners of surface 804. In one example, no new circular marks are added and the plurality of circular marks 812 moved together as a group are towards a corner as shown in the depicted example.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An apparatus comprising:
    a substrate having a surface, the substrate being adapted to be mounted to a printed circuit board; and
    a plurality of electrically-conductive attachments arranged on the surface of the substrate to mount the substrate to the printed circuit board, the plurality of electrically-conductive attachments including:
        a plurality of solder balls arranged into a ball grid array on the surface of the substrate, wherein adjacent solder balls in the ball grid array are positioned at a pitch from each other and wherein solder balls in the ball grid array have the shape of a truncated sphere, and
        one or more solder islands positioned on the surface of the substrate among the plurality of solder balls in the ball grid array, each solder island having a mass of solder greater than the mass of any of the plurality of solder balls and having a larger size and different shape than the size and shape of any of the plurality of the solder balls.

2. The apparatus of claim 1 wherein at least two solder balls of the ball grid array are combined to form the at least one solder island in the ball grid array on the surface of the substrate having the shape that is different than the shape of the truncated sphere.

3. The apparatus of claim 1 further comprising a camera module mounted on the ball grid array.

4. The apparatus of claim 3 further comprising a reinforcement structure disposed over the camera module.

5. The apparatus of claim 3, wherein the camera module is mounted on the printed circuit board by reflowing the ball grid array to form the solder island to form a solder joint between the substrate and the printed circuit board.

6. The apparatus of claim 4, wherein the camera module is mounted on the printed circuit board by reflowing the ball grid array to form the solder island to form a solder joint between the substrate and the printed circuit board, and wherein the reinforcement structure is attached to the printed circuit board.

7. The apparatus of claim 3, wherein the camera module comprises an image sensor, a lens, a substrate, and a housing mounted on the ball grid array.

8. The apparatus of claim 1 wherein the portion of the plurality of solder balls of the ball grid array having the pitch between adjacent solder balls of the ball grid array is a first portion of the plurality of solder balls of the ball grid array and wherein the pitch between adjacent solder balls of the ball grid array is a uniform pitch, wherein the plurality of solder balls of the ball grid array includes a second portion of the plurality of solder balls of the ball grid array, wherein the second portion of solder balls of the ball grid array is arranged to have the uniform pitch between adjacent solder balls of the ball grid array, wherein a distance between the first and second portions of the plurality of solder balls of the ball grid array is different from the uniform pitch between adjacent solder balls of the ball grid array of the first and second portions of the plurality of solder balls of the ball grid array.

9. An apparatus comprising:
a camera module having a bottom, the bottom of the camera module being adapted to be mounted to a printed circuit board;
a reinforcement structure disposed over the camera module; and
a plurality of electrically-conductive attachments arranged on the bottom of the camera module to mount the camera module to the printed circuit board, the plurality of electrically-conductive attachments including:
a plurality of solder balls arranged into a ball grid array on the bottom of the camera module, wherein adjacent solder balls in the ball grid array are positioned at a pitch from each other and wherein solder balls in the ball grid array have the shape of a truncated sphere, and
one or more solder islands positioned on the bottom of the cameral module among the plurality of solder balls in the ball grid array, each solder island having a mass of solder greater than the mass of any of the plurality of solder balls and having a larger size and different shape than the size and shape of any of the plurality of solder balls.

10. The apparatus of claim 9 wherein at least two solder balls of the ball grid array are combined to form the at least one solder island in the ball grid array on the surface of the substrate of the camera module having the shape that is different than the shape of the truncated sphere.

11. The apparatus of claim 9, wherein the camera module comprises an image sensor, a lens, a substrate, and a housing mounted to the ball grid array.

12. An apparatus comprising:
a substrate having a surface, the substrate being adapted to be mounted to a printed circuit board; and
a plurality of electrically-conductive attachments arranged on the surface of the substrate to mount the substrate to the printed circuit board, the plurality of electrically-conductive attachments including:
a plurality of solder lands arranged into a land grid array on the surface of the substrate, wherein adjacent solder lands in the land grid array are positioned at a pitch from each other and wherein solder lands in the land grid array are circular and made of solder paste, and
one or more solder islands positioned on the surface of the substrate and included in at least one solder land in the land grid array, each solder island having a mass of solder greater than the mass of any of the plurality of solder lands and having a larger size and different shape than the size and shape of any of the plurality of solder lands.

13. The apparatus of claim 12 wherein at least two solder lands of the land grid array are combined to form the at least one solder island in the land grid array on the surface of the substrate having the shape that is different than the shape of the circular solder land.

14. The apparatus of claim 12 further comprising a camera module mounted on the land grid array.

15. The apparatus of claim 14 further comprising a reinforcement structure disposed over the camera module.

16. The apparatus of claim 14, wherein the camera module is mounted on the printed circuit board by reflowing the land grid array comprising the at least one solder island to form a solder joint between the substrate and the printed circuit board.

17. The apparatus of claim 12 wherein the portion of the plurality of solder lands of the land grid array having the pitch between adjacent solder lands of the land grid array is a first portion of the plurality of solder lands of the land grid array and wherein the pitch between adjacent solder lands of the land grid array is a uniform pitch, wherein the plurality of solder lands of the land grid array includes a second portion of the plurality of solder lands of the land grid array, wherein the second portion of solder lands of the land grid array is arranged to have the uniform pitch between adjacent solder lands of the land grid array, wherein a distance between the first and second portions of the plurality of solder lands of the land grid array is different from the uniform pitch between adjacent solder lands of the land grid array of the first and second portions of the plurality of solder lands of the land grid array.

18. The apparatus of claim 1 wherein the solder islands and the solder balls both have the same height.

19. The apparatus of claim 9 wherein the solder islands and the solder balls both have the same height.

* * * * *